US012563868B2

(12) United States Patent
Rajan et al.

(10) Patent No.: US 12,563,868 B2
(45) **Date of Patent: *Feb. 24, 2026**

(54) TUNNEL JUNCTION ULTRAVIOLET LIGHT EMITTING DIODES WITH ENHANCED LIGHT EXTRACTION EFFICIENCY

(71) Applicant: Ohio State Innovation Foundation, Columbus, OH (US)

(72) Inventors: Siddharth Rajan, Columbus, OH (US); Yuewei Zhang, Columbus, OH (US); Zane Jamal-Eddine, Columbus, OH (US); Fatih Akyol, Corum/ Merkez (TR)

(73) Assignee: Ohio State Innovation Foundation, Columbus, OH (US)

( * ) Notice: Subject to any disclaimer, the term of this patent is extended or adjusted under 35 U.S.C. 154(b) by 164 days.

This patent is subject to a terminal disclaimer.

(21) Appl. No.: 18/134,333

(22) Filed: Apr. 13, 2023

(65) Prior Publication Data

US 2023/0335675 A1 Oct. 19, 2023

Related U.S. Application Data

(63) Continuation of application No. 17/516,796, filed on Nov. 2, 2021, now Pat. No. 11,658,267, which is a (Continued)

(51) Int. Cl.
*H01L 33/20* (2010.01)
*H01L 33/06* (2010.01)
(Continued)

(52) U.S. Cl.
CPC ........ *H10H 20/819* (2025.01); *H10H 20/812* (2025.01); *H10H 20/8314* (2025.01); *H10H 20/825* (2025.01); *H10H 20/835* (2025.01)

(58) Field of Classification Search
CPC ......... H01L 33/06; H01L 33/04; H01L 33/20; H01L 33/38; H01L 33/16; H10H 20/819;
(Continued)

(56) References Cited

U.S. PATENT DOCUMENTS 6,515,308 B1 2/2003 Kneissl et al.
6,515,313 B1 2/2003 Ibbetson et al.
(Continued)

FOREIGN PATENT DOCUMENTS

CN 103337568 A 10/2013

OTHER PUBLICATIONS

Yonkee et al., Demonstration of a III-nitride edge-emitting laser diode utilizing a GaN tunnel junction contact, Apr. 4, 2016 | vol. 24, No. 71 DOI:10.1364/OE.24.007816 | Optics Express 7820 (Year: 2016).*
(Continued)

*Primary Examiner* — Lawrence C Tynes, Jr.
(74) *Attorney, Agent, or Firm* — Meunier Carlin & Curfman LLC

(57) ABSTRACT

An example tunnel junction ultraviolet (UV) light emitting diode (LED) is described herein. The UV LED can include a mesa structure having at least one of: an n-doped bottom contact region, a p-doped region, and a tunnel junction arranged in contact with the p-doped region. Additionally, a geometry of the mesa structure can be configured to increase respective efficiencies of extracting transverse-electric (TE) polarized light and transverse-magnetic (TM) polarized light from the tunnel junction UV LED. The mesa structure can be configured such that an emitted photon travels less than 10 μm before reaching the inclined sidewall.

21 Claims, 15 Drawing Sheets

Related U.S. Application Data continuation of application No. 16/610,158, filed as application No. PCT/US2018/030512 on May 1, 2018, now Pat. No. 11,211,525.

(60) Provisional application No. 62/492,460, filed on May 1, 2017.

(51) Int. Cl.

| | |
|---|---|
| ***H01L 33/38*** | (2010.01) |
| ***H10H 20/812*** | (2025.01) |
| ***H10H 20/819*** | (2025.01) |
| ***H10H 20/831*** | (2025.01) |
| *H10H 20/825* | (2025.01) |
| *H10H 20/832* | (2025.01) |

(58) Field of Classification Search
CPC ............. H10H 20/812; H10H 20/8314; H10H 20/825; H10H 20/835; H10H 20/831; H10H 20/817; H10H 20/811
See application file for complete search history.

(56) References Cited

U.S. PATENT DOCUMENTS

| | | | |
|---|---|---|---|
| 6,724,013 | B2 | 4/2004 | Kneissl et al. |
| 6,822,991 | B2 | 11/2004 | Collins, III et al. |
| 7,012,279 | B2 | 3/2006 | Wierer, Jr. et al. |
| 7,160,747 | B2 | 1/2007 | Haberern et al. |
| 7,501,294 | B1 | 3/2009 | Nakagawa |
| 7,872,272 | B2 | 1/2011 | Bour et al. |
| 8,410,490 | B2 | 4/2013 | Denbaars et al. |
| 9,059,356 | B1 | 6/2015 | Miller et al. |
| 9,142,726 | B2 | 9/2015 | David et al. |
| 9,627,579 | B2 | 4/2017 | Collins et al. |
| 9,691,938 | B2 | 6/2017 | Atanackovic et al. |
| 11,211,525 | B2 * | 12/2021 | Rajan .................... H01L 33/385 |
| 2005/0067627 | A1 | 3/2005 | Shen et al. |
| 2005/0179047 | A1 | 8/2005 | Schaff et al. |
| 2006/0110839 | A1 | 5/2006 | Dawson et al. |
| 2007/0194300 | A1 | 8/2007 | Ibbetson et al. |
| 2008/0277682 | A1 | 11/2008 | Mishra et al. |
| 2009/0014712 | A1 | 1/2009 | Suzuki |
| 2009/0090932 | A1 | 4/2009 | Bour et al. |
| 2010/0006873 | A1 | 1/2010 | Raring et al. |
| 2010/0224860 | A1 | 9/2010 | Ibbetson et al. |
| 2010/0264460 | A1 | 10/2010 | Grandusky et al. |
| 2011/0204376 | A1 | 8/2011 | Su et al. |
| 2011/0220871 | A1 | 9/2011 | Kamikawa et al. |
| 2012/0068189 | A1 | 3/2012 | Hite et al. |
| 2014/0145224 | A1 | 5/2014 | Hsu et al. |
| 2015/0144875 | A1 | 5/2015 | Zhong et al. |
| 2016/0149074 | A1 | 5/2016 | Atanackovic et al. |
| 2018/0076354 | A1 | 3/2018 | Rajan et al. |

OTHER PUBLICATIONS https://www.academia.edu/22592587/Strongly_transverse_electric_polarized_emission_from_deep_ultraviolet_AlGaN_quantum_well_light_emitting_diodes, 2015.*

Yonkee et al. ,Demonstration of a II-nitride edge-emitting laser diode utilizing a GaN tunnel junction contact, 2016.*

International Search Report and Written Opinion issued by the International Searching Authority (ISA/US) in PCT Application No. PCT/US2018/030512 on Jul. 27, 2018. 9 pages.

Krishnamoorthy, S. et al., "Low resistance GaN/InGaN/GaN tunnel junctions," Applied Physics Letters 102, 113503 (2013).

Park, P. S. et al., "Recess-Free Nonalloyed Ohmic Contacts on Graded AlGaN Heterojunction FETs," IEEE Electron Device Letters, vol. 36, No. 3, pp. 226-228, Mar. 2015.

Rajan, S. et al., "III-Nitride Tunnel Junctions: Devices and Applications," ISDRS 2013, Dec. 11-13, 2013.

Krishnamoorthy, S. et al., "InGaN/GaN tunnel junctions for hole injection in GaN light emitting diodes," Applied Physics Letters 105, 141104 (2014).

Zhang, Y. et al., "Interband tunneling for hole injection in III-nitride ultraviolet emitters," Applied Physics Letters 106, 141103 (Apr. 2015).

* cited by examiner

TUNNEL JUNCTION ULTRAVIOLET LIGHT EMITTING DIODES WITH ENHANCED LIGHT EXTRACTION EFFICIENCY

CROSS-REFERENCE TO RELATED APPLICATIONS

This application is a continuation of U.S. patent application Ser. No. 16/610,158, filed on Nov. 1, 2019, which is a national stage application filed under 35 U.S.C. § 371 of PCT/US2018/030512 filed May 1, 2018, which claims the benefit of U.S. provisional patent application No. 62/492,460, filed on May 1, 2017, and entitled "TUNNEL JUNCTION ULTRAVIOLET LIGHT EMITTING DIODES WITH ENHANCED LIGHT EXTRACTION EFFICIENCY," the disclosures of which are expressly incorporated herein by reference in their entireties.

STATEMENT REGARDING GOVERNMENT SUPPORT

This invention was made with government support under grant number ECCS1408416 awarded by the National Science Foundation. The government has certain rights in the invention.

BACKGROUND

Ill-Nitride ultraviolet light emitting diodes (UV LEDs) have a variety of promising applications including sterilization and water purification. UV light emissions down to 210 nm have been achieved for AlGaN-based UV LEDs. However, the wall-plug efficiency (WPE) of UV LEDs remains much lower than InGaN-based visible LEDs, especially in the wavelength range below 365 nm, even though high radiative efficiency up to 80% has been demonstrated due to optimized substrate and active region quality. The reduced efficiency is attributed to a combination of the poor light extraction efficiency due to high internal light absorption in the widely used p-GaN cap layer and the low injection efficiency associated with the low thermally activated hole density. Both originate from the high acceptor activation energy in AlGaN, which leads to poor p-type conductivity and resistive p-type contacts.

Tunnel junctions for wide band gap materials can enable greater efficiency in AlGaN-based LUV LEDs. Currently, UV LEDs use an absorbing p-GaN top layer for hole injection, which reduces light extraction efficiency. Even though many methods have been used to enhance the light extraction efficiency for conventional UV LEDs, it remains lower than 20% due to internal light absorption. Efficient tunnel junctions can enable transparent n-AlGaN contact and spreading layers on top of p-AlGaN, enabling significantly higher light extraction efficiency. In the UV-B and UV-C wavelength ranges, poor hole availability in the p-AlGaN layer also affects the injection efficiency and leads to poor balancing of electron and hole currents. Efficient tunnel junctions can provide significant advantages by enabling more efficient non-equilibrium injection of holes.

However, to obtain efficient tunneling in LEDs, narrower band gap materials than the barrier or quantum well layers of the LED active region are used. Such layers can cause absorption losses, especially when the in-plane emission mode (TM) is significant, such as for short (<320 nm) wavelength emission.

SUMMARY

An example tunnel junction ultraviolet (UV) light emitting diode (LED) is described herein. The UV LED can include a mesa structure having at least one of: an n-doped bottom contact region, a p-doped region, and a tunnel junction arranged in contact with the p-doped region. Additionally, a geometry of the mesa structure can be configured to increase respective efficiencies of extracting transverse-electric (TE) polarized light and transverse-magnetic (TM) polarized light from the tunnel junction UV LED. The mesa structure can be configured such that an emitted photon travels less than 10 μm before reaching the inclined sidewall.

Alternatively or additionally, in some implementations, the mesa structure can optionally have an elongated shape. Optionally, an aspect ratio of the mesa structure is greater than 5. Alternatively or additionally, the mesa structure can further include at least two inclined sidewalls. Alternatively or additionally, the elongated shape of the mesa structure can optionally form a straight pattern or a zig zag pattern. The straight pattern or the zig zag pattern can be configured such that an emitted photon travels less than 10 μm before reaching the inclined sidewall. Alternatively or additionally, the elongated shape of the mesa structure can optionally form a curved pattern, a sinusoidal pattern, or a spiral pattern. The curved pattern, the sinusoidal pattern, or the spiral pattern can be configured such that an emitted photon travels less than 10 μm before reaching the inclined sidewall. Optionally, a radius of curvature of the curved pattern, the sinusoidal pattern, or the spiral pattern is less than 100 μm.

Alternatively or additionally, in some implementations, the mesa structure can optionally have a truncated pyramid shape. Optionally, the mesa structure can include at least three inclined sidewalls. Alternatively or additionally, in some implementations, the mesa structure can optionally have a truncated cone shape.

Alternatively or additionally, the mesa structure can further include an active region configured to emit UV light. The active region can be arranged between the p-doped region and the n-doped bottom contact region. Alternatively or additionally, the inclined sidewall can be formed in at least a portion of the active region. In some implementations, the tunnel junction can be arranged above the p-doped region. Optionally, the UV LED can further include an n-doped top contact region, and the tunnel junction can be arranged between the n-doped top contact region and the p-doped region. Optionally, at least one of the n-doped top contact region or the n-doped bottom contact region can include a roughened surface. The n-doped top contact region can be arranged on the inclined sidewall of the mesa structure.

Alternatively or additionally, in some implementations, the inclined sidewall can be formed in at least a portion of the p-doped region, and the tunnel junction can be arranged below the p-doped region. Optionally, the UV LED can further include an active region arranged in contact with at least a portion of the inclined sidewall of the mesa structure. Optionally, the UV LED can further include an n-doped top contact region, and the active region can be arranged between the p-doped region and the n-doped top contact region.

Alternatively or additionally, the UV LED can include a reflective material arranged on at least a portion of the inclined sidewall of the mesa structure. Optionally, the reflective material can be aluminum (Al). Alternatively or additionally, the UV LED can include a reflective material arranged on the n-doped top contact region. In some implementations, the UV LED can further include a dielectric material arranged on at least a portion of the inclined sidewall of the mesa structure.

Alternatively or additionally, the inclined sidewall can include a plurality of portions having different angles of inclination.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIG. 2B illustrates a top down view of a mesa structure with a six-sided truncated pyramid shape. FIG. 2C illustrates a top down view of a mesa structure with a four-sided truncated pyramid shape. FIG. 2D illustrates a top down view of a mesa structure with a truncated cone shape. FIG. 2E illustrates mesa structures with an elongated shape having straight, curved, and sinusoidal patterns. FIG. 2F illustrates a mesa structure with an elongated shape having a spiral pattern. FIG. 2G illustrates a mesa structure with an elongated shape having a straight pattern. FIG. 2H illustrates a mesa structure with an elongated shape having a sinusoidal pattern. FIG. 2I illustrates a mesa structure with an elongated shape having a mesh pattern.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an" "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. While implementations will be described for aluminum gallium nitride (AlGaN) based tunnel junction UV LEDs, it will become evident to those skilled in the art that the implementations are not limited thereto, but are applicable for other III-Nitride based tunnel junction UV LEDs including, but not limited to, gallium nitride (GaN) and indium aluminum gallium nitride (InAlGaN) UV LEDs.

Figure 1:
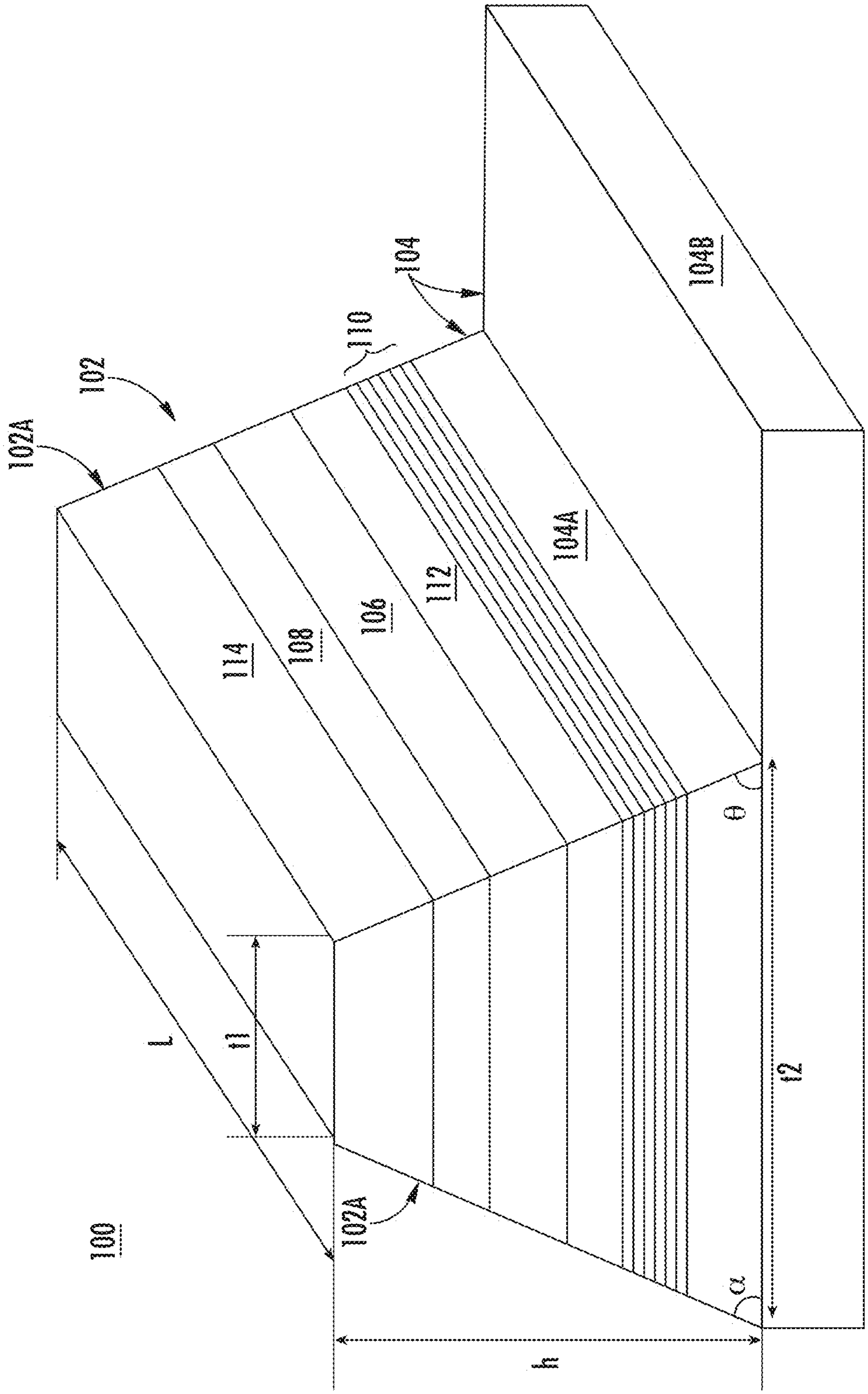
FIG. 1 illustrates an example tunnel junction UV LED according to implementations described herein.
Figure 2A:
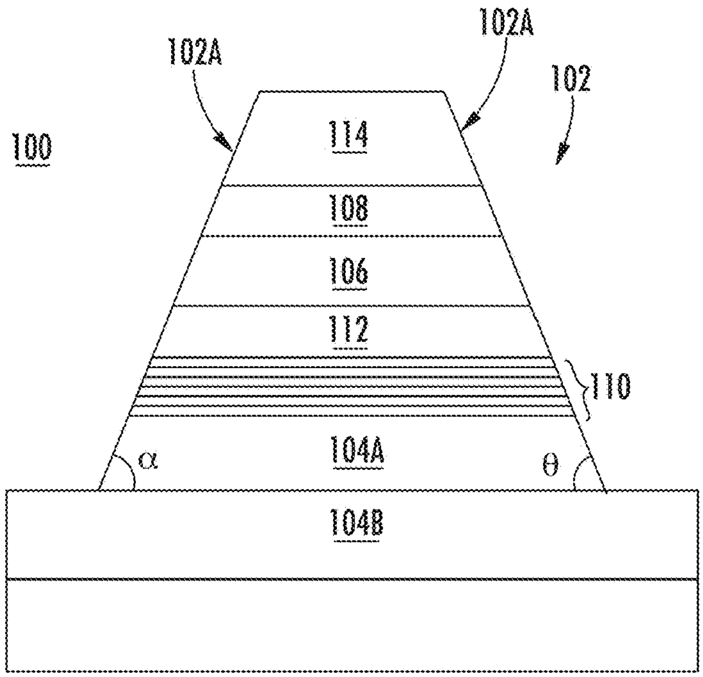
FIG. 2A illustrates a cross-sectional view of the tunnel junction UV LED of FIG. 1.

Referring now to FIGS. 1 and 2A, an example tunnel junction UV LED 100 (sometimes referred to herein as "tunnel injected UV LED") is shown. Example tunnel junction UV LEDs known in the art are described in WO 2016/160720, published Oct. 6, 2016, and entitled "ULTRAVIOLET LIGHT EMITTING DIODES WITH TUNNEL JUNCTION." The UV LED 100 described herein can include a mesa structure 102 having at least one of an n-doped bottom contact region 104, a p-doped region 106, and a tunnel junction 108 arranged in contact with the p-doped region 106. In some implementations, the n-doped bottom contact region can optionally include an n-doped cladding layer 104A and n-doped bottom contact layer 1043 (collectively referred to herein as "n-doped bottom contact region 104"). The n-doped bottom contact region 104 (i.e., the bottom or lower side contact of the UV LED 100) can form contact to high conductance semiconductor material, which connect the n-doped bottom contact region 104 to metal contact such as the contact region(s) described herein. The n-doped bottom contact region 104 can optionally be transparent, which facilitates light extraction from the bottom/lower side of the UV LED 100. As shown in the figures, the mesa structure 102 can be an elevated structure with respect to a substrate. Additionally, the mesa structure 102 can include one or more inclined sidewalls 102A as described herein. The UV LED 100 can also include an active region 110, an electron blocking region 112, and an n-doped top contact region 114.

In some implementations described herein, the UV LED 100 is an AlGaN based tunnel junction UV LED. It should be understood, however, that the UV LED 100 can be another III-Nitride based tunnel junction UV LED. As described above, the UV LED 100 can include the active region 110, which can be arranged between the n-doped bottom contact region 104 and the p-doped region 106, as shown in FIGS. 1 and 2A. Each of the n-doped bottom contact region 104 and the p-doped region 106 can be AlGaN of any composition such as $Al_{0.3}Ga_{0.7}N$, for example. The AlGaN of the n-doped bottom contact region 104 can be silicon (Si) doped with a concentration (i.e., [Si]) of about $3\times10^{18}$ $cm^{-3}$, and the AlGaN of the p-doped region 106 can be magnesium (Mg) doped with a concentration (i.e., [Mg]) of about $2\times10^{19}$ $cm^{-3}$. The active region 110 can be configured to emit UV light. For example, the active region 110 can include one or more quantum wells that emit UV light. The active region 110 can include three AlGaN quantum wells such as $Al_{0.2}Ga_{0.8}N$ quantum wells, for example. The UV LED 100 can include the electron blocking region 112 (sometimes referred to as "electron blocking layer") arranged between the active region 110 and the p-doped region 106. The electron blocking region 112 can be p-type AlGaN, for example. It should be understood that the materials, compositions, and/or doping concentrations are provided only as examples.

The UV LED 100 can also include the tunnel junction 103. The tunnel junction 103 can include at least one of InGaN, GaN, AlGaN, or InAlGaN. It should be understood that the tunnel junction 108 can be used to connect the n-doped top contact region 114 to the p-doped region 106. This is an alternative to using a direct p-type metal contact, and the use of the tunnel junction 103 enables enhancement of light extraction efficiency of UV LED. As shown in FIGS. 1 and 2A, the tunnel junction 108 can be arranged between the n-doped top contact region 114 (i.e., the top or upper side contact of the UV LED 100) and p-doped region 106. The n-doped top contact region 114 can form contact to high conductance semiconductor material, which connect the n-doped top contact region 114 to metal contact such as the contact region(s) described herein. The n-doped top contact region 114 can optionally be transparent, which facilitates light extraction from the top/upper side of the UV LED 100 (i.e., flip chip bonding would not required). Optionally, at least one of the n-doped top contact region 114 or the n-doped bottom contact region 104 can include a roughened surface (e.g., roughened surface 115 of FIGS. 5 and 6). The roughening can be performed using wet etching or dry etching techniques. This disclosure contemplates that using roughened surfaces can enhance the light extraction efficiency of the UV LED 100.

As described below, the UV LED 100 can further include contact regions (e.g., contact region 116 in FIGS. 3-6) arranged on the n-doped top contact region 114 and/or the n-doped bottom contact region 104, respectively. The contact region provides the means for making ohmic contact with the n-doped top contact region 114 and/or the n-doped bottom contact region 104. The contact region can be a semiconductor and/or conductive (e.g., metal) contact deposited directly onto the n-doped top contact region 114 and/or the n-doped bottom contact region 104, for example. In some implementations, the contact region can be conductive material. In some implementations, the contact region can be semiconductor material such as AlGaN (or other III-Nitride material). Optionally, the contact region can have a gradually varied material energy bandgap. For example, the relative material energy bandgap of the semiconductor material (e.g., AlGaN) of the contact region can decrease moving away from its interface with the n-doped top contact region 114 and/or the n-doped bottom contact region 104. In other words, the semiconductor material of the contact region can have a relatively large bandgap at the interface with the contact region graded to a relatively small bandgap at the interface with air. The graded material energy bandgap of the contact region helps set up a transition region between metal contacts and the relatively high material energy bandgap n-doped top contact region 114 and/or n-doped bottom contact region 104.

Figure 2B:
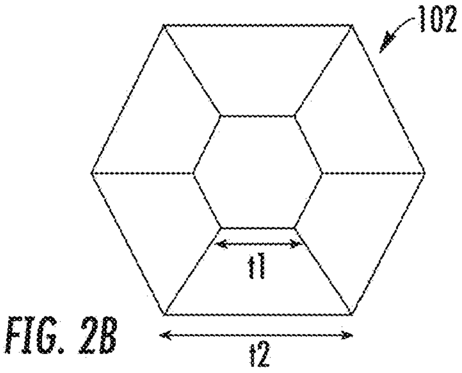
FIGS. 2B-2D illustrate top views of the tunnel junction UV LED of FIG. 1 with various shapes.
Figure 2C:
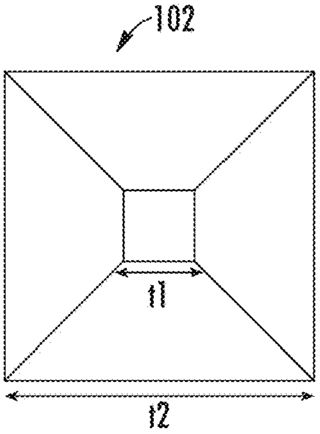

As described herein, the mesa structure 102 can be an elevated structure with respect to a substrate. Additionally, a geometry of the mesa structure 102 can be configured to increase an efficiency of extracting light from the tunnel junction UV LED 100. In some implementations, the geometry of the mesa structure 102 can be configured to increase respective efficiencies of extracting transverse-electric (TE) polarized light and transverse-magnetic (TM) polarized light from the tunnel junction UV LED 100. As shown in FIGS. 1 and 2A, the mesa structure 102 can include one or more inclined sidewalls 102A. The inclined sidewall 102A can have an inclination angle between 0° and 90° with respect to a support substrate. This disclosure contemplates that the angle of inclination can be controlled using the growth or micro-fabrication processes described herein. Optionally, the inclined sidewalls 102A can be passivated to reduce the influence of surface states on UV LED operations, and suppress current leakage through the inclined sidewalls 102A. This disclosure contemplates using passivation techniques including, but not limited to, etching, high temperature annealing, or ion implantation. Optionally, the mesa structure 102 includes two inclined sidewalls 102A (e.g., as shown in FIGS. 1 and 2A). Alternatively, the mesa structure can include more than two inclined sidewalls 102A such as three, four (e.g., as shown in FIG. 2C), five, six (e.g., as shown in FIG. 2B), etc. It should be understood that the mesa structures 102 described herein are only provided as examples and that mesa structures having different numbers of sidewalls can be used. Optionally, as shown in FIG. 1, the width of the top surface (t1) of the mesa structure 102 can range between 0 nm and 1 mm, and the width of the bottom (t2) of the mesa structure 102 can range between 0 nm and 1 mm. It should be understood that the width of the top surface (t1) and/or the width of the bottom (t2) of the mesa structure 102 can have other values than shown as an example in FIG. 1. For example, in some implementations, the width of a portion of a mesa structure can range between 0 nm and 10 μm. This can help ensure that an emitted photon travels less than 10 μm before reaching an inclined sidewall.

In some implementations, the mesa structure 102 can have an elongated shape. When the quantum wells of the active region 110 sit on polar planes, for example as shown in FIGS. 1, 2A, and 3-6, an elongated mesa structure 102 can be grown along the [0001] direction. In other words, the active region 110 can sit on a polar plane. Alternatively, when the quantum wells of the active region 110 sit on non-polar planes, for example as shown in FIGS. 7A-8B, an elongated mesa structure 102 can be grown along the [000-1] direction. In other words, the active region 110 can sit on a non-polar plane. This disclosure contemplates that the inclined sidewall 102A can be formed by an additive process (e.g., semiconductor growth process) or a reductive process (e.g., etching process including but not limited to ICP-RIE). Additive and reductive semiconductor processing techniques are known in the art and therefore not described in further detail herein. In some implementations, the inclined sidewall 102A of the mesa structure 102 can terminate in at least the active region 110. In other words, the inclined sidewall 102A can be formed in at least a portion of the active region 110. For example, as shown in FIGS. 1, 2A, and 3-6, the inclined sidewall 102A of the mesa structure 102 terminates in the n-doped bottom contact region 104. In other words, the inclined sidewall 102A extends through the n-doped top contact region 114, the tunnel junction 108, the p-doped region 106, the electron blocking region 112, the active region 110, and then terminates in the n-doped bottom contact region 104.

Figure 2D:
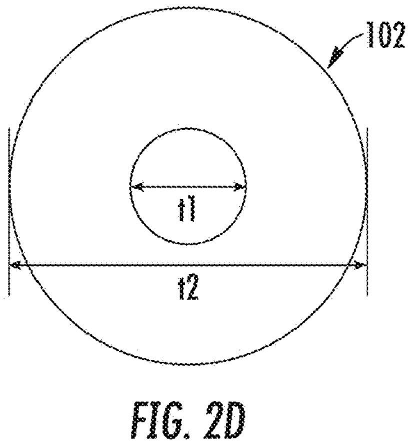

Referring now to FIGS. 23-2D, in some implementations, the mesa structure 102 can optionally have a truncated pyramid shape (e.g., FIGS. 2B and 2C). Optionally, the mesa structure 102 can include at least three inclined sidewalls 102A. FIG. 2B illustrates a mesa structure 102 with a six-sided truncated pyramid shape. FIG. 2C illustrates a mesa structure 102 with a four-sided truncated pyramid shape. It should be understood that the truncated pyramid shapes shown in FIGS. 2B and 2C are examples only, e.g., the mesa structure 102 can include more or less six sides. Alternatively or additionally, in some implementations, the mesa structure 102 can have a truncated cone shape. FIG. 20 illustrates a mesa structure 102 with a truncated cone shape.

Figure 2E:
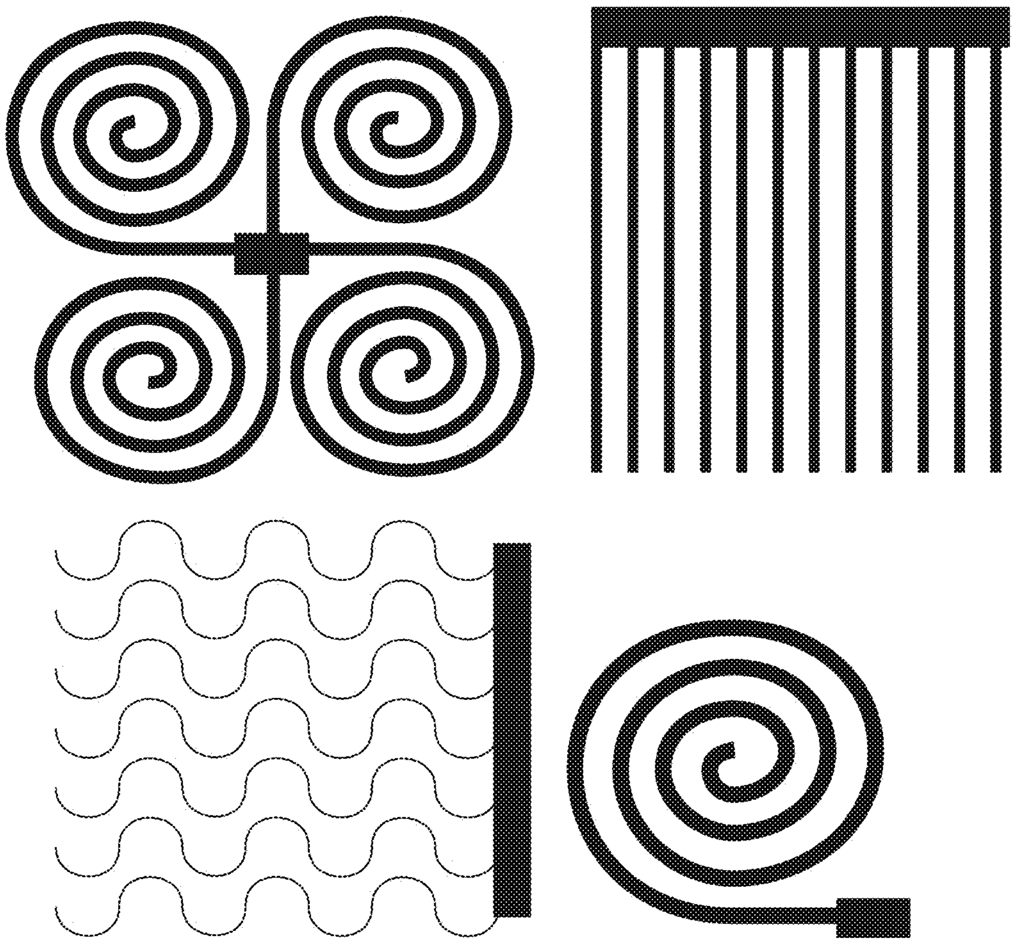
FIGS. 2E-2I illustrate top views of mesa structures with an elongated shape having various patterns.
Figure 2F:
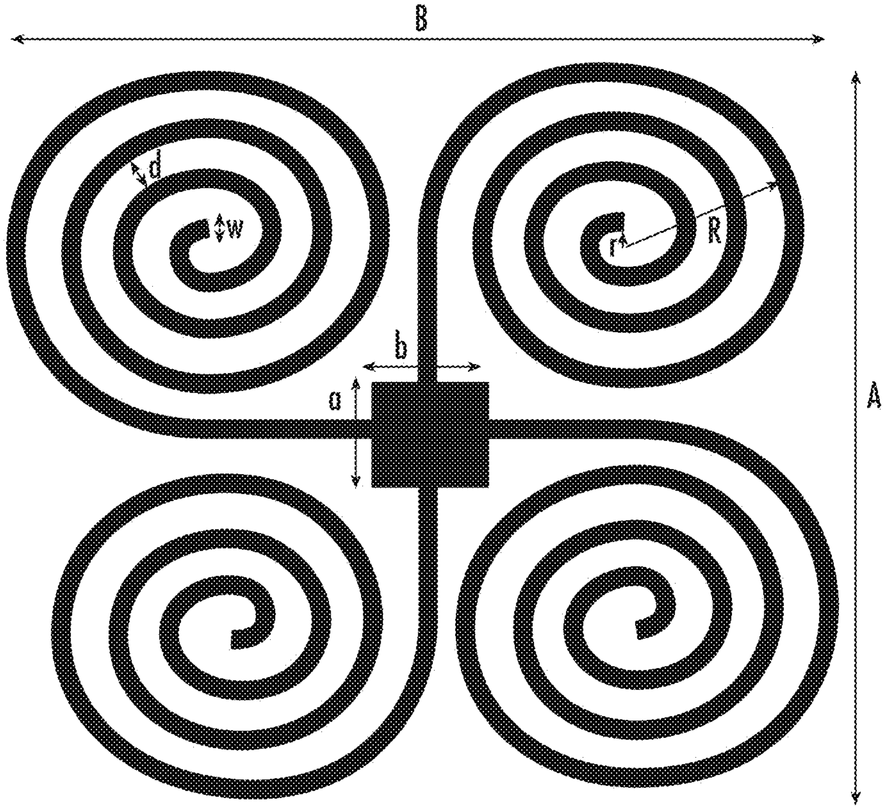
Figure 2G:
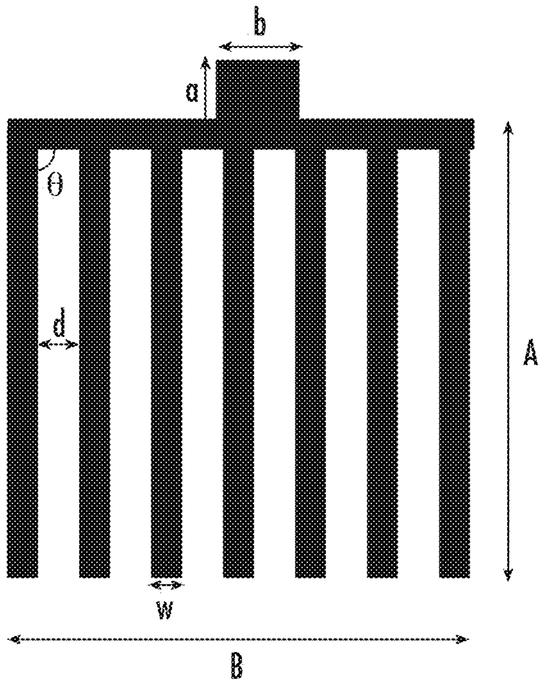
Figure 2H:
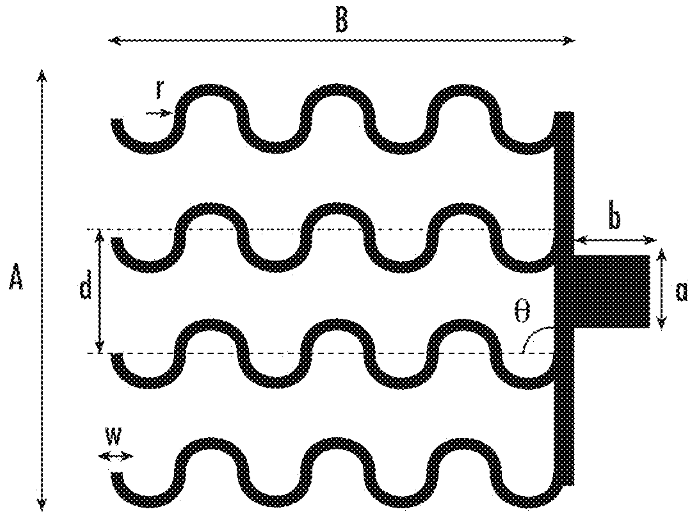
Figure 2I:
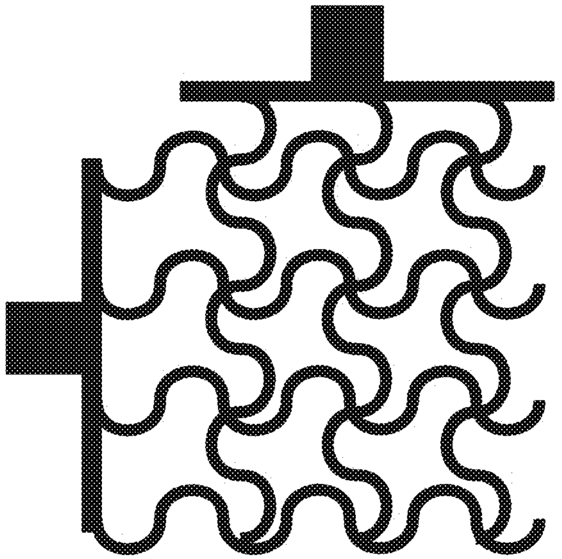
Figure 3:
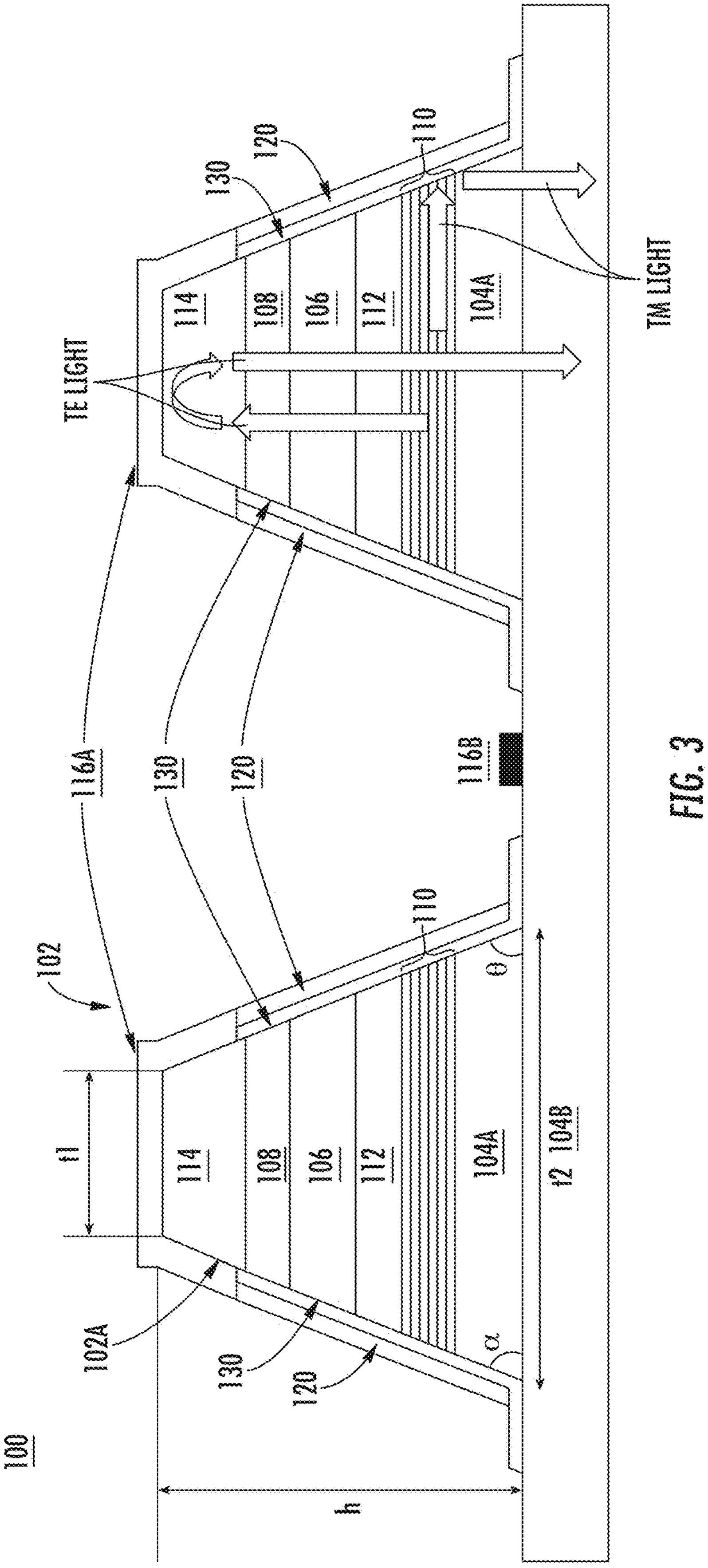
FIG. 3 illustrates an example tunnel junction UV LED where the device includes a reflective layer arranged on the inclined sidewalls of the mesa structure according to implementations described herein.

An aspect ratio (e.g., a ratio of length to width in top view) of the mesa structure 102 can be greater than 5. In other words, the mesa structure 102 can be substantially longer than it is wide. It should be understood that an aspect ratio of 5 is provided only as an example and that aspect ratios more or less than 5 can be used. In some implementations, the elongated shape of the mesa structure 102 can optionally form a straight pattern or a zig zag pattern. In other implementations, the elongated shape of the mesa structure 102 can optionally form a curved pattern, a sinusoidal pattern, or a spiral pattern. FIGS. 2E-2I illustrate top views of mesa structures with an elongated shape having various patterns. FIG. 2E illustrates mesa structures with an elongated shape having straight, curved, and sinusoidal patterns. FIG. 2F illustrates a mesa structure with an elongated shape having a spiral pattern. In FIG. 2F, the mesa structure can have the following dimensions: 1<number of loops in one spiral<500; 50 nm<d<10 μm; 50 nm<r<100 μm; 50 nm<R<5 mm; 1≤number of spirals<1000; 100 nm<a<10 mm; 100 nm<b<10 μm; w<10 μm; 1 μm<A<100 mm; 1 μm<B<100 mm. This disclosure contemplates that the portion of the mesa structure defined by "a" and "b" in FIG. 2F can be any shape. Additionally, it should be understood that the number of spirals (e.g., 4 in FIG. 2F), as well as the number of loops per spiral, are provided only as examples and that the mesa structure can have other spiral and/loop configurations than as shown in FIG. 2F. FIG. 2G illustrates a mesa structure with an elongated shape having a straight pattern. In FIG. 2G, the mesa structure can have the following dimensions: 50 nm<d<10 μm; 1<number of fingers<500; 90°<θ<10°; 1≤number of finger patterns<1000; 100 nm<a<10 mm; 100 nm<b<100 mm; w<10 μm; 1 μm<A<100 mm; 1 μm<B<100 mm. This disclosure contemplates that the portion of the mesa structure defined by "a" and "b" in FIG. 2G can be any shape. This disclosure also contemplates that the individual fingers in in FIG. 2G do not need to have parallel alignment (e.g., θ can vary) and/or the spacing between individual fingers can vary (e.g., "d" can vary). Additionally, it should be understood that the number of finger patterns (e.g., 1 in FIG. 2G), as well as the number of individual fingers per pattern (e.g., 7 in FIG. 2G), are provided only as examples and that the mesa structure can have other finger configurations than as shown in FIG. 2G. FIG. 2H illustrates a mesa structure with an elongated shape having a sinusoidal pattern. In FIG. 2H, the mesa structure can have the following dimensions: 50 nm<d<10 μm; 1<number of fingers<500; 90° <θ<10°; 1≤number of finger patterns<1000; 100 nn<a<10 mm; 100 nm<b<100 mm; w<10 μm; 50 nm<r<100 μm; 1 μm<A<100 mm; 1 μm<B<100 mm. This disclosure contemplates that the portion of the mesa structure defined by "a" and "b" in FIG. 2H can be any shape. This disclosure also contemplates that the individual fingers in in FIG. 2H do not need to have parallel alignment (e.g., θ can vary). This disclosure also contemplates that "d" and/or "r" can vary between individual fingers and/or within the same finger. Additionally, it should be understood that the number of finger patterns (e.g., 1 in FIG. 2H), as well as the number of individual fingers per pattern (e.g., 4 in FIG. 2H), are provided only as examples and that the mesa structure can have other finger configurations than as shown in FIG. 2H. FIG. 2I illustrates a mesa structure with an elongated shape having a mesh pattern. It should be understood that the mesa structure patterns (and dimensions) described herein are provided only as examples and that other patterns (and dimensions) can be used.

Figure 9:
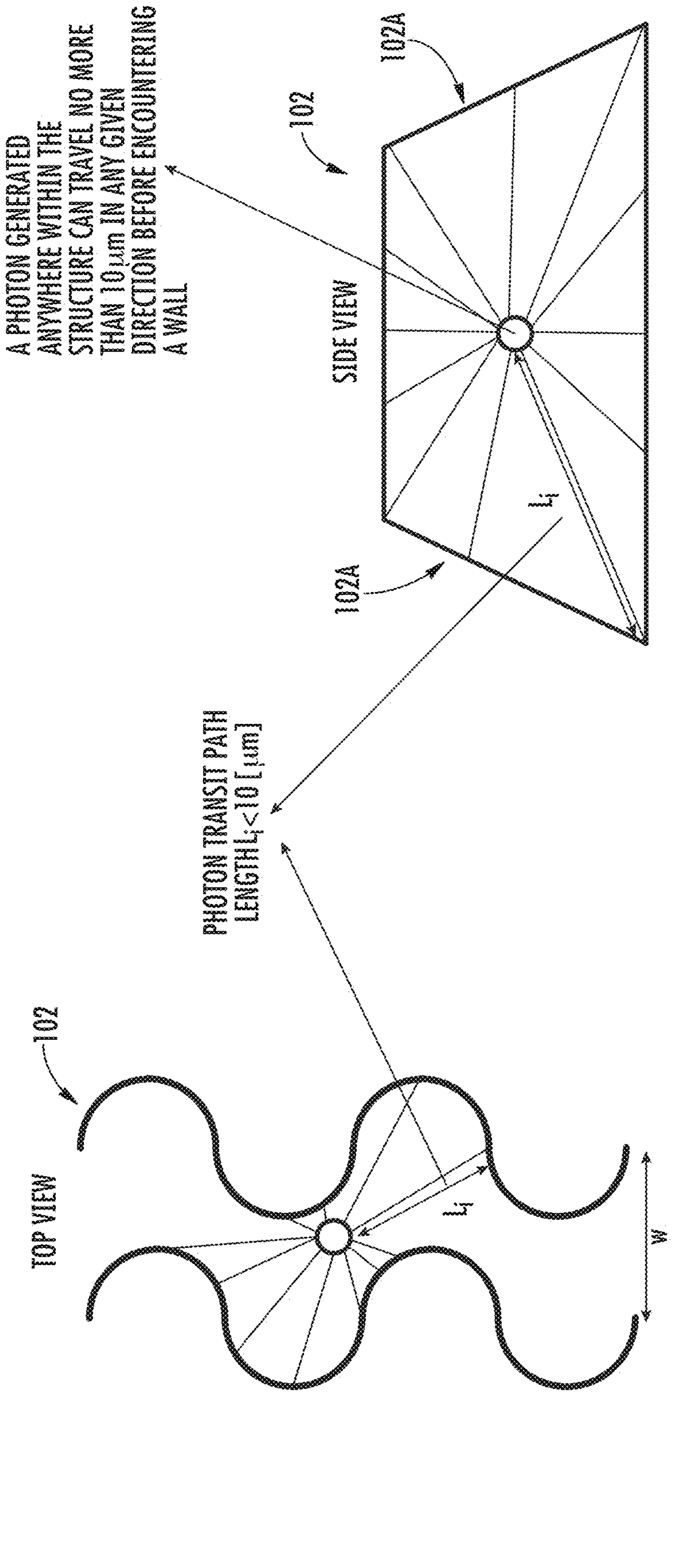
FIG. 9 illustrates an example mesa structure having a photon path length of 10 μm or less according to implementations described herein.
Figure 10:
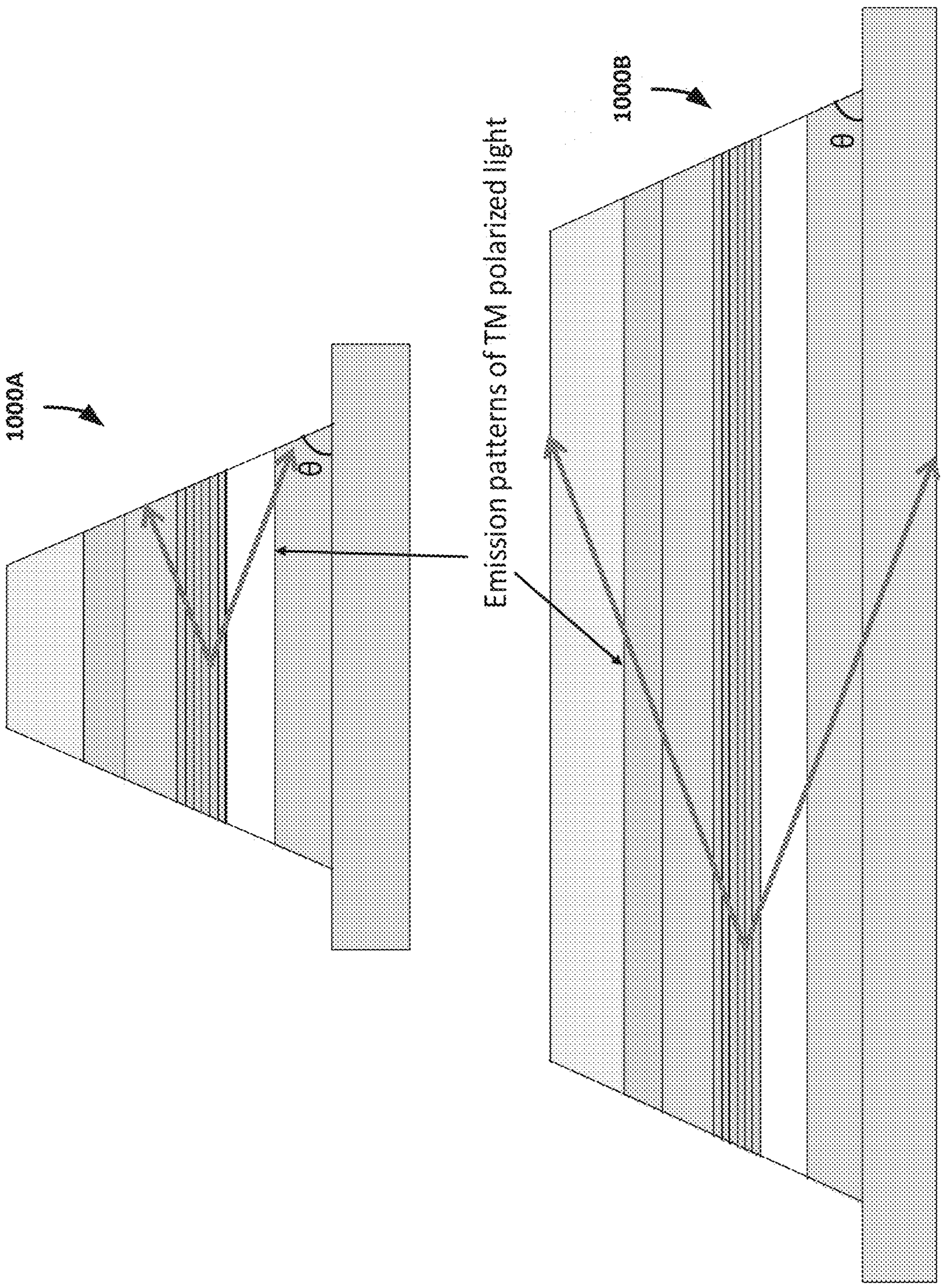
FIG. 10 illustrates example mesa structures according to implementations described herein.

In some implementations, the pattern of the mesa structure (e.g., straight, zigzag, curved, sinusoidal, etc.) can be configured such that an emitted photon travels less than 10 μm before reaching an inclined sidewall. This ensures that most of the TM polarized photons can reach the inclined sidewall instead of reaching the top or bottom interfaces of the mesa structure (e.g., see FIG. 10). This also reduces the internal light absorption loss, which happens when light travels inside the material of the UV LED. In other words, the geometry of the patterns of the elongated mesa structure 102 can be used to reduce the likelihood of photon absorption. FIG. 9 illustrates photon travel path in an example UV LED shown in both top view and side view (or cross-sectional view). As shown in FIG. 9, the mesa structure 102 includes inclined sidewalls 102A. As a result of the pattern of the elongated mesa structure, a photon generated anywhere within the UV LED can travel no more than 10 μm in any direction before encountering a wall of the LUV LED (e.g., top, side, bottom, etc.). In other words, each point in the active region of the UV LED is less than 10 μm from an inclined sidewall. As described below, reflective layer(s) can be provided to reflect the emitted light. In some implementations, each point in the active region of the UV LED is less than 10 μm from an inclined sidewall over which a reflective layer is arranged. By designing the LIV LED such that photons can travel only 10 μm or less, the likelihood of photon absorption by materials of the UV LED before being reflected by reflective layer(s) is decreased. Additionally, FIG. 10 illustrates photon travel path in example UV LEDs in side view (or cross-sectional view). In FIG. 10, mesa structure 1000A (e.g., narrow mesa) is configured to have a photon path length of 10 μm or less. A majority of TM polarized photons can reach the inclined sidewalls of mesa structure 1000A. On the other hand, in mesa structure 1000B (e.g., broad mesa), more TM polarized photons can reach the top and/or bottom interfaces of the mesa structure 1000B, which makes it more difficult to extract such TM polarized photons from the UV LED. Alternatively or additionally, the curved pattern, the sinusoidal pattern, or the spiral pattern of the elongated mesa structure can optionally be configured such that a radius of curvature (e.g., dimension "r" in FIGS. 2F and 2H) of the curved pattern, the sinusoidal pattern, or the spiral pattern is less than 100 μm. This ensures that an emitted photon travels less than 10 μm before reaching an inclined sidewall, which ensures that most of the TM polarized photons can reach the inclined sidewall instead of reaching the top or bottom interfaces of the mesa structure (e.g., see FIG. 10). This also reduces the internal light absorption loss, which happens when light travels inside the material of the UV LED. It should be understood that the radius of curvature can be other values such as 90, 80, 70, . . . 10 μm, for example. This disclosure contemplates that the curved patterns can have constant or variable radii of curvature.

Referring now to FIGS. 3-6, example UV LEDs 100 according to other implementations described herein are shown. Similar to FIGS. 1 and 2A, the UV LED 100 can include a mesa structure 102 having at least one of an n-doped bottom contact region 104, a p-doped region 106, and a tunnel junction 108 arranged in contact with the p-doped region 106. Additionally, the mesa structure 102 can include one or more inclined sidewalls 102A as described herein. The UV LED 100 can also include an active region 110, an electron blocking region 112, and an n-doped top contact region 114. Light can be extracted from the bottom side of the UV LED 100 in FIGS. 3-6 (i.e., through the n-doped bottom contact region 104).

In addition, the UV LED 100 can include a reflective material (or reflective layer) 120 arranged on at least a portion of the inclined sidewall 102A of the mesa structure 102. For example, the reflective material 120 can be deposited on the inclined sidewall 102A (or on dielectric material as described below). The reflective material 120 can have high reflectivity for the emitted UV light. The reflective material 120 can be any UV reflective material, such as aluminum, or can be UV reflective structures, such as specifically designed distributed Bragg reflector (DBR) structures. This disclosure contemplates that a dielectric DBR can be designed to have refractivity near unity for the emitted wavelength from the active region 110. Optionally, the reflective material 120 can be aluminum (Al). Optionally, the reflective material 120 can have a thickness between 0 nm and 10 mm.

In some implementations, the UV LED 100 can further include a dielectric material 130 arranged on at least a portion of the inclined sidewall 102A of the mesa structure 102. The dielectric material 130 can be transparent to the emitted UV light, and insulated to current flow. The UV light absorption coefficient of the dielectric material 130 can be lower than $10^4$ $cm^{-1}$. For example, the dielectric material 130 can be $SiO_2$ or $Al_2O_3$ or any other JV transparent material. The dielectric material 130 can be deposited on the inclined sidewall 102A. Optionally, the dielectric material 130 can cover the inclined sidewall 102A areas from the bottom of the n-doped top contact region 114 to the top of the n-doped bottom contact region 104. Optionally, the dielectric material 130 can be arranged between the inclined sidewall 102A and the reflective material 120 as shown in FIGS. 3-6. Alternatively or additionally, the reflective material 120 and the dielectric material 130 can be arranged on different portions of the inclined sidewall 102A of the mesa structure 102. As shown in FIGS. 3-6, the reflective material 120 and/or the dielectric material 130 can be configured to internally reflect the UV light emitted by the active layer 110. Both the TE and TM light can be reflected, which increases light extraction efficiency of the UV LED 100.

Figure 5:
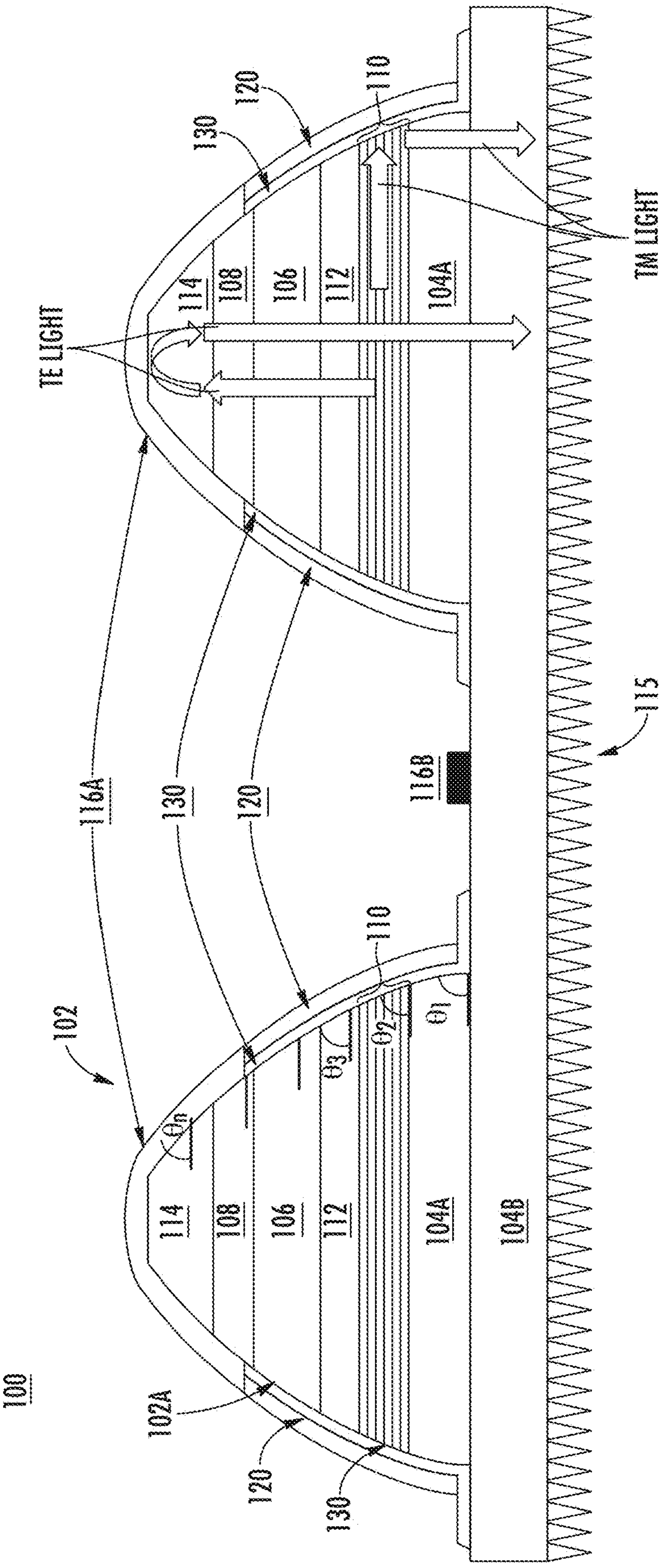
FIG. 5 illustrates an example tunnel junction UV LED with a roughened surface according to implementations described herein.
Figure 6:
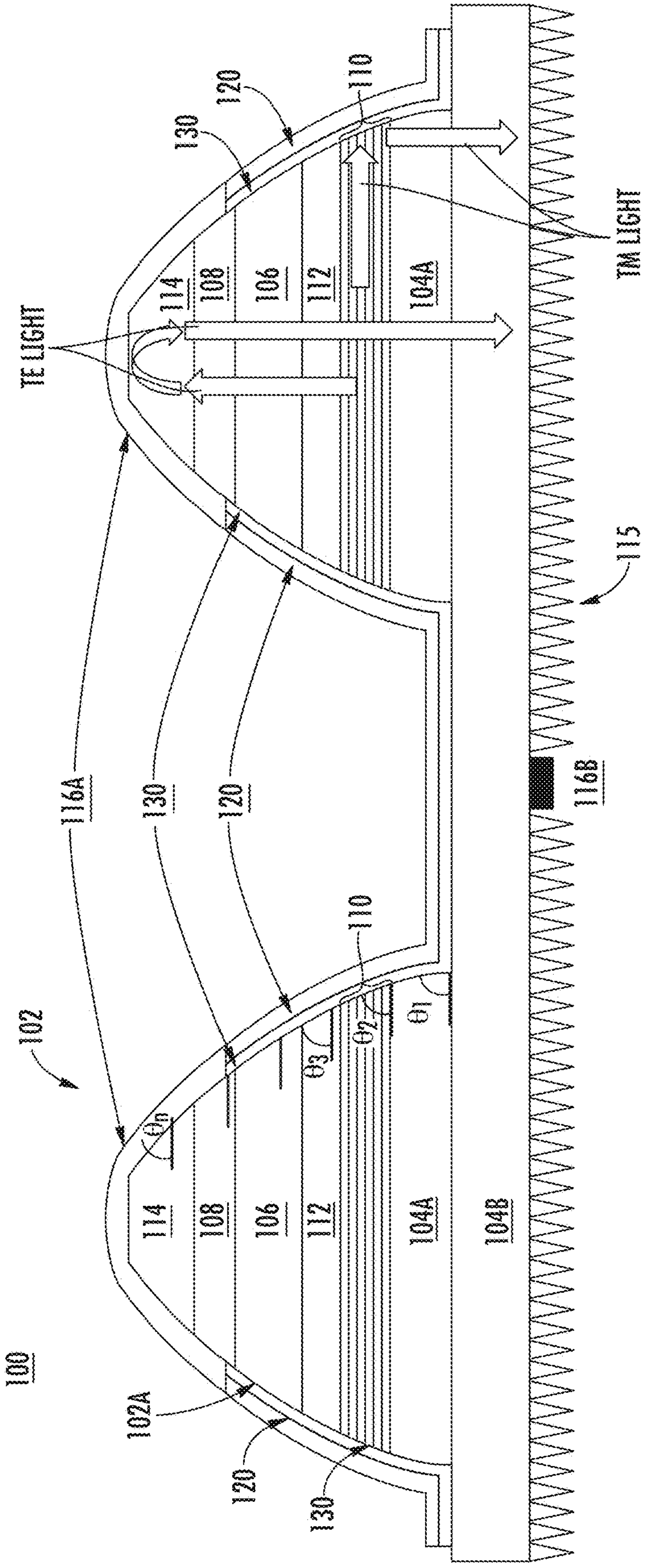
FIG. 6 illustrates another example tunnel junction UV LED with a roughened surface according to implementations described herein.

Further, a contact region 116A can be arranged on the n-doped top contact region 114, and a contact region 116B can be arranged on the n-doped bottom contact region 104. The contact regions are collectively referred to herein as "contact region 116." As described above, the contact region 116 provides the means for making ohmic contact with the n-doped top contact region 114 and/or the n-doped bottom contact region 104. Optionally, as shown in FIGS. 5 and 6, the UV LED 100 can also include a roughened surface 115. Optionally, the n-doped top contact region 114 can be covered with reflective contact metals. The reflective contact metals can have aluminum as the first metal layer. The aluminum layer thickness can range from 1 nm to 1 mm. Alternatively or additionally, in some implementations, the first metal layer can be in direct contact with the n-doped top contact region 114, e.g., the first metal layer of the reflective contact metals can serve as the contact region 116A.

Figure 4:
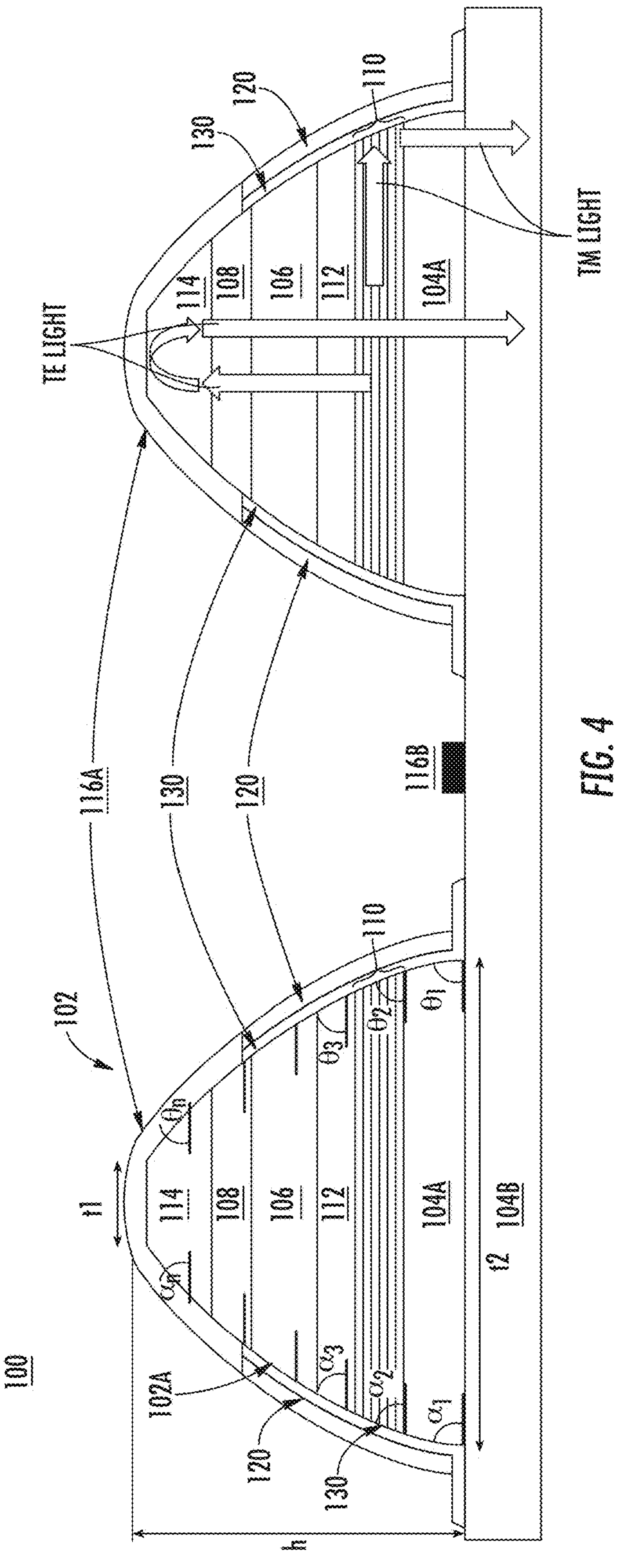
FIG. 4 illustrates an example tunnel junction UV LED where the inclined sidewalls of the mesa structure include a plurality of portions with different inclination angles according to implementations described herein.

Referring now to FIGS. 4-6, in some implementation, the inclined sidewall 102A of the mesa structure 102 include a plurality of portions with different inclination angles (e.g., $\theta_1$, $\theta_2$, $\theta_3$, . . . $\theta_n$ and/or $\alpha_1$, $\alpha_2$, $\alpha_3$, . . . $\alpha_n$). The inclined sidewall 102A can have portions with inclination angles between 0° and 90° with respect to a support substrate. This disclosure contemplates that the angle of inclination can be controlled using the growth or reduction processes described herein. The number of portions with different inclination angles and angles thereof shown in FIGS. 4-6 are provide only as an example. This disclosure contemplates that the inclined sidewall 102A can include any number of portions with different inclination angles.

Referring now to FIGS. 7A-8B, example tunnel junction UV LEDs 200 where the active region is arranged on inclined sidewalls of the mesa structure are shown. Similar to FIGS. 1 and 2A, the UV LED 200 can include a mesa structure 102 having at least one of an n-doped bottom contact region 104, a p-doped region 106, and a tunnel junction 108 arranged in contact with the p-doped region 106. Additionally, the mesa structure 102 can include one or more inclined sidewalls 102A as described herein. The UV LED 100 can also include an active region 110, an electron blocking region 112, and an n-doped top contact region 114. Light can be extracted from the top side of the UV LED 200 as shown in FIGS. 7A-8B (i.e., through the n-doped top contact region 114).

Figure 7A:
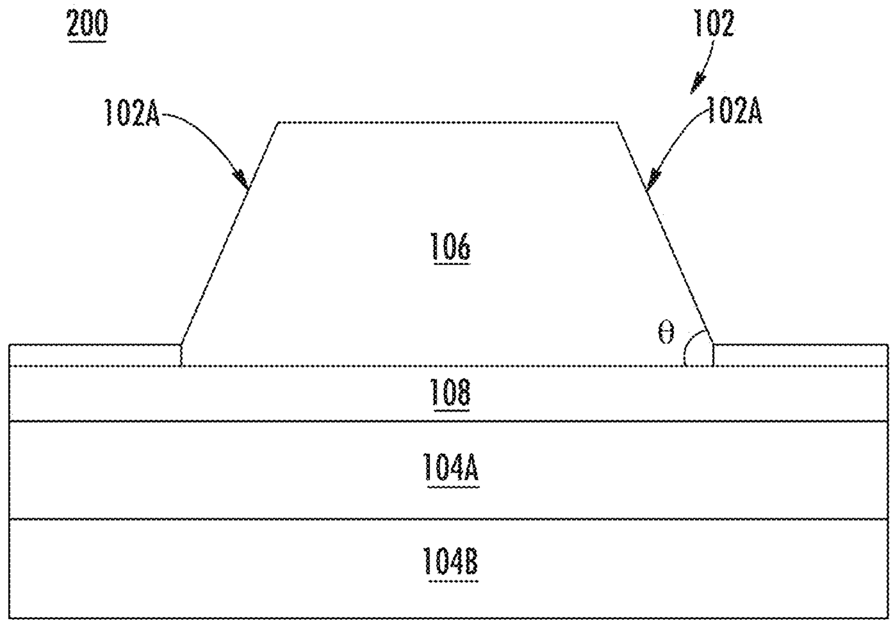
FIG. 7A illustrates an example tunnel junction UV LED where the active region is arranged on the inclined sidewalls of the mesa structure according to implementations described herein.
Figure 7B:
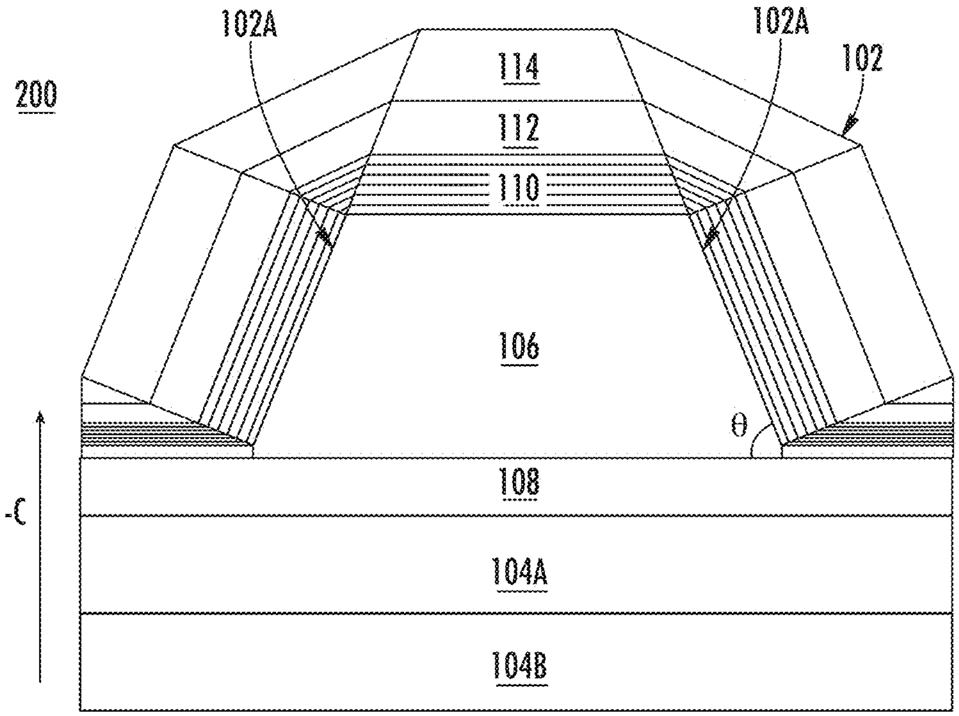
FIG. 7B illustrates the tunnel junction UV LED shown in FIG. 7A with the active region, electron blocking region, and n-doped top contact region.
Figure 8A:
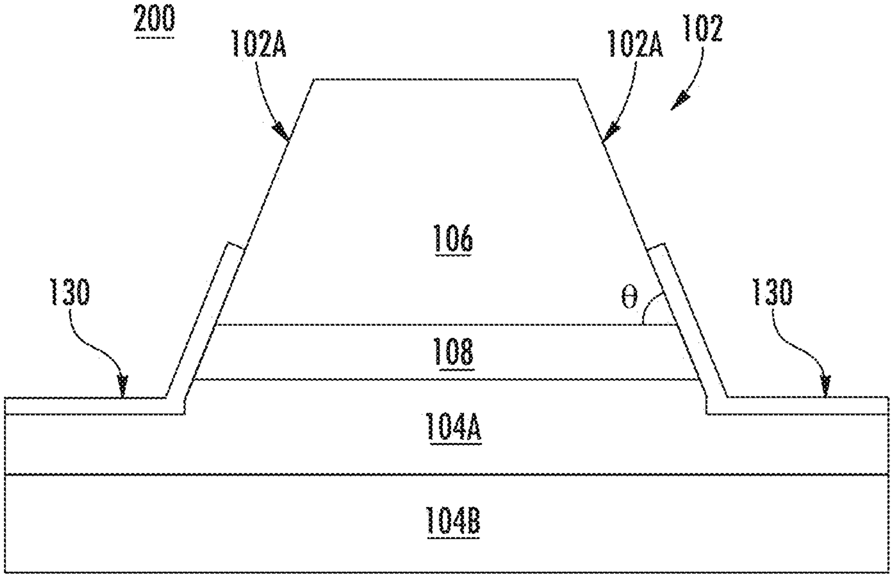
FIG. 8A illustrates another example tunnel junction UV LED where the active region is arranged on the inclined sidewalls of the mesa structure according to implementations described herein.
Figure 8B:
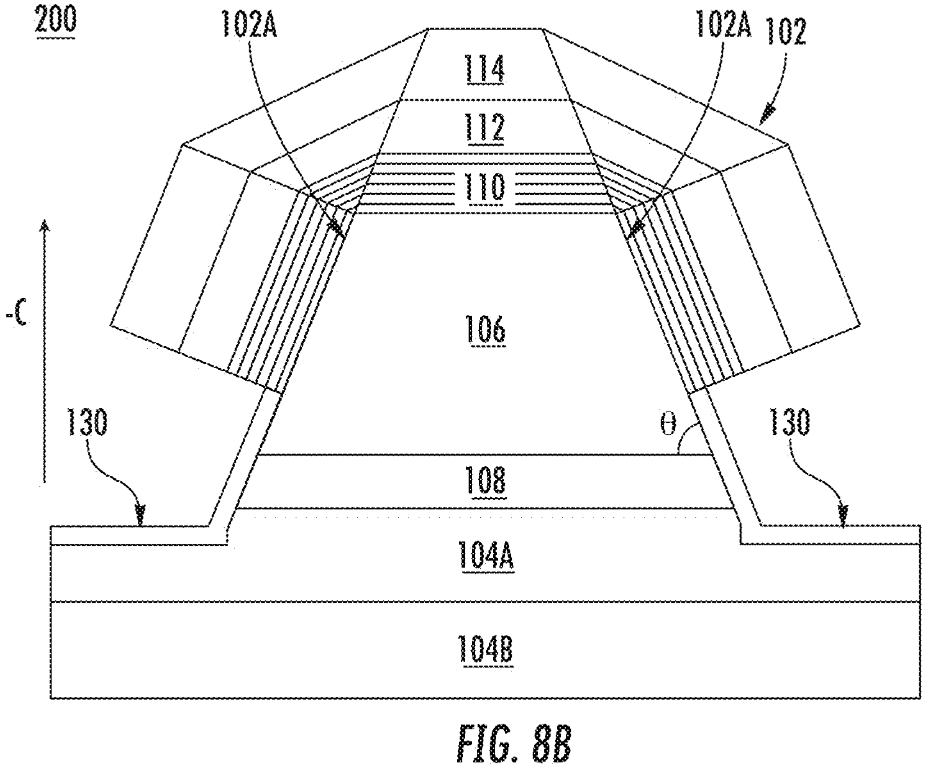
FIG. 8B illustrates the tunnel junction UV LED shown in FIG. 8A with the active region, electron blocking region, and n-doped top contact region.

In FIGS. 7A-8B, the tunnel junction 108 can be arranged below the p-doped region 106. As described above, the inclined sidewall 102A can be formed by known additive or reductive semiconductor processing techniques. Optionally, the inclined sidewall 102A can terminate in at least a portion of the p-doped region 106 as shown in FIGS. 7A-8B. For example, in FIGS. 7A and 7B, the inclined sidewall 102A extends through the n-doped top contact region 114, the electron blocking region 112, and the active region 110, and then terminates in the p-doped region 106. In FIGS. 8A and 8B, the inclined sidewall 102A extends through the n-doped top contact region 114, the electron blocking region 112; the active region 110, the p-doped region 106, and the tunnel junction 108, and then terminates in the n-doped bottom contact region 104. Additionally, the elongated mesa structure 102 can be grown along the [000-1] direction, and the active region 110 can be arranged in contact with at least a portion of the inclined sidewall 102A of the mesa structure 102 such that the active region 110 sits on a non-polar plane (e.g., as shown in FIGS. 7B and 8B). The UV LED 200 can further include the n-doped top contact region 114, and the active region 110 can be arranged between the p-doped region 106 and the n-doped top contact region 114. In some implementations, the active region 110 can occupy the entire length of the inclined sidewall 102A as shown in FIG. 7B. In other implementations, the active region 110 can occupy only a portion of the inclined sidewall 102A as shown in FIG. 8B. In this case, a dielectric material 130 can be provided. Further, this disclosure contemplates that UV LED 200 can further include contact regions arranged on the n-doped top contact region 114 and/or the n-doped bottom contact region 104, respectively. The contact region provides the means for making ohmic contact with the n-doped top contact region 114 and/or the n-doped bottom contact region 104. Optionally, the n-doped top contact region 114 can include a roughened surface. The roughening can be performed using wet etching or dry etching techniques. This disclosure contemplates that using roughened surfaces can enhance the light extraction efficiency of the UV LED 200.

EXAMPLES

A structure to enhance the light extraction efficiency using a tunnel junction based UV LED structure is described herein. Currently, UV LEDs use an absorbing pGaN top layer for hole injection, which greatly reduces light extraction efficiency to be lower than 20%. The structure can be used to enhance both the transverseelectric and transverse-magnetic polarized light by integrating angled mirrors on top of a tunnel junction based LED structure. This structure removes the need to include widely used light absorbing p-type contact layers, and provides highly reflective mirrors to minimize internal light absorption and achieve greatly enhanced light extraction efficiency. This structure can potentially lead to up to 80% light extraction efficiency, making it highly favorable for industry applications.

The tunnel injected UV LED structure substitutes the absorbing p-type contact layers using an interband tunneling contact by connecting a transparent n-AlGaN top contact layer to the p-AlGaN layer using a interband tunnel junction. This enables n-type metal contact to both the top and bottom contact layer. Aluminum, which is widely used as an n-type ohmic contact metal to AlGaN material, is highly reflective for UV light covering a wide wavelength range from 200 nm to 400 nm. Combining the reflective aluminum contact and the tunnel-injected UV LED structure provides a device geometry for light extraction of both transverse-electric (TE) and transverse-magnetic (TM) light, making it possible to achieve enhanced light extraction efficiency for LEDs.

A structure to reduce these absorption losses and to increase the light extraction efficiency by integrating angled mirrors on top of a tunnel junction based LED structure is described herein. In this approach, the device mesa structures are etched to obtain inclined sidewalls. The quantum wells of the UV LED structure can sit on polar, non-polar or semi-polar planes. Reflective material is deposited on these contacts so that both horizontally and vertically oriented light beams incident on the mirror surface is reflected downward after one or more passes.

In the case when quantum wells sit on polar planes, the mesa structure grows along [0001] direction and the tunnel junction layer is on top of the p-AlGaN layer. The device mesa is defined by etching to the n-AlGaN bottom contact layer, and is processed to obtain an inclined sidewall, which can be achieved using either dry etching or wet etching methods. For example, inductively coupled plasma reactive ion etching (ICP-RIE) can be used to define the inclined sidewall. By controlling the etch conditions, different inclination angles (θ) can be achieved. The device mesa can be processed into long stripes as shown in the figures (e.g., FIGS. 2E-2I), so that two flat sidewalls with different angles of inclination are obtained. The stripe shape is not limited to be straight. It can be curved shapes to reduce the travel distance before the emitted light can reach the sidewalls. This can greatly enhance the light extraction efficiency, and reduce the internal light absorption. The device mesa can also be processed into pyramidal structures as shown in the figures (e.g., FIGS. 2B-2D). In this case, more sidewalls are inclined. For example, there are six or four inclined sidewalls when the mesa is processed using hexagon or square masks, and the whole sidewall is inclined when the mesa is processed into cones.

The quantum wells can also sit on non-polar or semi-polar planes. The structure grows along [000-1] direction and the tunnel junction layer sits below the p-AlGaN layer. The n-AlGaN bottom contact layer, the tunnel junction layer and the p-AlGaN layer are grown in order. Then the sample is processed to obtain inclined sidewalls on the p-AlGaN layer using the etching methods discussed above. After the formation of the inclined sidewalls, the quantum well active region, electron blocking layer and the n-AlGaN top contact layer are further deposited to finalize the structure. As a result, tilted QW planes are obtained (e.g., as shown in FIGS. 7B and 8B). Since the TM polarized light propagates along the QW plane, the UV light can be extracted from the vertical direction due to the inclination of the QW planes. The light extraction can be further facilitated by added reflection mirrors on the n-AlGaN top contact layer, so that the emitted light can be reflected and extracted from the bottom surface of the structure.

Another variation of the method can be related to the etching step to form the inclined sidewall. The etching can stop in the bottom n-AlGaN contact layer (e.g., as shown in FIGS. 8A and 8B). Following that, a dielectric material can be deposited on the etched surfaces, while the surface of the p-AlGaN layers is exposed. The dielectric material is to passivate, and prevent electrical leakage to the bottom n-AlGaN layers. The remaining layers can be grown on top of this patterned surface to finalize the device structure. The III-Nitride growth on top of the dielectric layer could be polycrystalline, and can be removed by chemical etching. This results in similar device geometry as that has been described above.

Following the fabrication of the inclined sidewalls for the above polar, semi-polar or non-polar active region devices, a dielectric layer is used to cover the whole device mesa region. The dielectric material can be highly transparent to UV light. Possible materials are $SiO_2$ or $Al_2O_3$. The dielectric layer should not conduct current during device operation. A surface passivation method, such as chemical etching or high temperature annealing, is used to passivate the etched sidewall surface to reduce leakage current. This can be done either before or after the deposition of the dielectric layer. A UV reflective material is then deposited on the dielectric layer. The reflective material can be aluminum or distributed Bragg reflector (DBR) structures. The dielectric layer is to avoid any possible influence on the device from the reflective material. The top contact is deposited on the top n-AlGaN surface. UV reflective metal contact should be used. For example, aluminum can be used for Ohmic contact metal and it provides high reflectivity for UV light. As a result, all the device mesa sidewalls are covered with UV reflective materials. Both the TE and TM light emitted from the quantum wells can be reflected and redirected to the bottom surface with very few reflections. This minimizes the internal light absorption loss, and at the same time enables efficient light extraction for both TE and TM polarized light.

The sidewall of the device mesa can be further processed to have different inclination angles as shown the figures (e.g., FIG. 4). This can be achieved by controlling the etching processes. This mesa geometry can further minimize the internal reflections of the emitted UV light and provide better light extraction efficiency. The back surface can be further roughened using any surface roughening or patterning techniques, including both wet etching and dry etching methods. This is to minimize the back reflection of light at the bottom surface/air interface. The back surface can also be processed into photonic crystal structure to enhance the out coupling of the emitted light.

Due to the complete coverage of the top contact layer, the n-AlGaN top contact layer thickness can be greatly reduced to a few nanometers. This brings the absorbing tunnel junction layer close to the reflective metal contact. It can further reduce the absorption loss due to the tunnel junction layer.

The bottom metal contact can be deposited on the backside surface of the devices as shown in the figures (e.g., FIG. 6). In this case, the empty regions between the device mesas can be covered with reflective material. This maximizes the light reflection from the top surfaces.

In accompany with the proposed device geometry, further device packaging can be required to maximize the light extraction from the bottom surface.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A tunnel junction ultraviolet (UV) light emitting diode (LED), comprising:

a mesa structure comprising at least one of:

an n-doped bottom contact region, a p-doped region, and a tunnel junction arranged in contact with the p-doped region, wherein a geometry of the mesa structure is configured to increase respective efficiencies of extracting transverse-electric (TE) polarized light and transverse-magnetic (TM) polarized light from the tunnel junction UV LED, and wherein the mesa structure is configured such that an emitted photon travels less than 10 μm before reaching an inclined sidewall of the mesa structure.

2. The tunnel junction UV LED of claim 1, wherein the mesa structure has an elongated shape.

3. The tunnel junction UV LED of claim 2, wherein an aspect ratio of the mesa structure is greater than 5.

4. The tunnel junction UV LED of claim 2, wherein the mesa structure comprises at least two inclined sidewalls.

5. The tunnel junction UV LED of claim 2, wherein the elongated shape of the mesa structure forms a straight pattern or a zig zag pattern.

6. The tunnel junction UV LED of claim 2, wherein the elongated shape of the mesa structure forms a curved pattern, a sinusoidal pattern, or a spiral pattern.

7. The tunnel junction UV LED of claim 6, wherein a radius of curvature of the curved pattern, the sinusoidal pattern, or the spiral pattern is less than 100 μm.

8. The tunnel junction UV LED of claim 1, wherein the mesa structure has a truncated pyramid shape.

9. The tunnel junction UV LED of claim 8, wherein the mesa structure comprises at least three inclined sidewalls.

10. The tunnel junction UV LED of claim 1, wherein the mesa structure has a truncated cone shape.

11. The tunnel junction UV LED of claim 1, wherein the mesa structure further comprises an active region configured to emit UV light, the active region being arranged between the p-doped region and the n-doped bottom contact region.

12. The tunnel junction UV LED of claim 11, wherein the inclined sidewall of the mesa structure is formed in at least a portion of the active region.

13. The tunnel junction UV LED of claim 11, wherein the tunnel junction is arranged above the p-doped region.

14. The tunnel junction UV LED of claim 11, further comprising an n-doped top contact region, wherein the tunnel junction is arranged between the n-doped top contact region and the p-doped region.

15. The tunnel junction UV LED of claim 14, wherein at least one of the n-doped top contact region or the n-doped bottom contact region comprises a roughened surface.

16. The tunnel junction UV LED of claim 14, further comprising a reflective material arranged on at least a portion of the n-doped top contact region.

17. The tunnel junction UV LED of 16, wherein the reflective material comprises aluminum (Al).

18. The tunnel junction UV LED of claim 1, wherein the inclined sidewall is formed in at least a portion of the p-doped region.

19. The tunnel junction UV LED of claim 18, wherein the tunnel junction is arranged below the p-doped region.

20. The tunnel junction UV LED of claim 1, further comprising a dielectric material arranged on at least a portion of the inclined sidewall of the mesa structure.

21. The tunnel junction UV LED of claim 1, wherein the inclined sidewall comprises a plurality of portions having different angles of inclination.

* * * * *